United States Patent
Shih et al.

(10) Patent No.: US 9,823,585 B2
(45) Date of Patent: Nov. 21, 2017

(54) EUV FOCUS MONITORING SYSTEMS AND METHODS

(71) Applicant: Taiwan Semiconductor Manufacturing Company, Ltd., Hsin-Chu (TW)

(72) Inventors: Chih-Tsung Shih, Hsinchu (TW); Chieh-Jen Cheng, Hsinchu (TW); Jeng-Horng Chen, Hsinchu (TW); Chia-Chen Chen, Hsinchu (TW); Shinn-Sheng Yu, Hsinchu (TW); Anthony Yen, Hsinchu (TW); Wei-Chih Lai, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 14 days.

(21) Appl. No.: 14/852,805

(22) Filed: Sep. 14, 2015

(65) Prior Publication Data

US 2016/0291482 A1    Oct. 6, 2016

Related U.S. Application Data

(60) Provisional application No. 62/140,829, filed on Mar. 31, 2015.

(51) Int. Cl.
G03B 27/68    (2006.01)
G03B 27/52    (2006.01)
G03F 7/20     (2006.01)

(52) U.S. Cl.
CPC ............... *G03F 7/70641* (2013.01)

(58) Field of Classification Search
CPC ..................... G03F 7/70641; G03F 7/2022
USPC ............................... 355/52, 53, 55
See application file for complete search history.

(56) References Cited

U.S. PATENT DOCUMENTS

| | | | |
|---|---|---|---|
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |

(Continued)

FOREIGN PATENT DOCUMENTS

CN    102597873    7/2012

*Primary Examiner* — Hung Henry Nguyen
(74) *Attorney, Agent, or Firm* — Haynes and Boone, LLP

(57) ABSTRACT

Systems and methods for monitoring the focus of an EUV lithography system are disclosed. Another aspect includes a method having operations of measuring a first shift value for a first patterned set of sub-structures of a focus test structure on a wafer and measuring a second shift value for a second patterned set of sub-structures of the test structure on the wafer. The test structure may be formed on the wafer using asymmetric illumination, with the first patterned set of sub-structures having a first pitch and the second patterned set of sub-structures having a second pitch that is different from the first pitch. The method may further include determining a focus shift compensation for an illumination system based on a difference between the first shift value and the second shift value.

20 Claims, 8 Drawing Sheets

(56) References Cited

U.S. PATENT DOCUMENTS

| | | |
|---|---|---|
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 2004/0073322 A1* | 4/2004 | Maenishi ............ H05K 13/0452 700/28 |
| 2007/0041003 A1 | 2/2007 | Ausschnitt et al. |
| 2009/0021711 A1 | 1/2009 | Sato et al. |
| 2010/0081093 A1 | 4/2010 | Kasa et al. |
| 2016/0033879 A1* | 2/2016 | Raghunathan ...... G03F 7/70641 355/55 |
| 2016/0238939 A1* | 8/2016 | Brunner ................ G03F 7/2022 |

\* cited by examiner

EUV FOCUS MONITORING SYSTEMS AND METHODS

PRIORITY DATA

This application claims priority from U.S. Provisional Patent Application No. 62/140,829, entitled "Systems and Methods for EUV Focus Monitoring" and filed on Mar. 31, 2015, the disclosure of which is incorporated herein in its entirety.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

As the sized has decreased, maintaining the reliability in patterning processes and the yields produced by the patterning processes has become more difficult. In some cases, the use of optical proximity correction and the adjustment of lithography parameters such as the duration of a process, the wavelength, focus, and intensity of light used can mitigate some defects. However, the current and systems for patterning material layers in semiconductor wafers has not been entirely satisfactory.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

Figure 1:
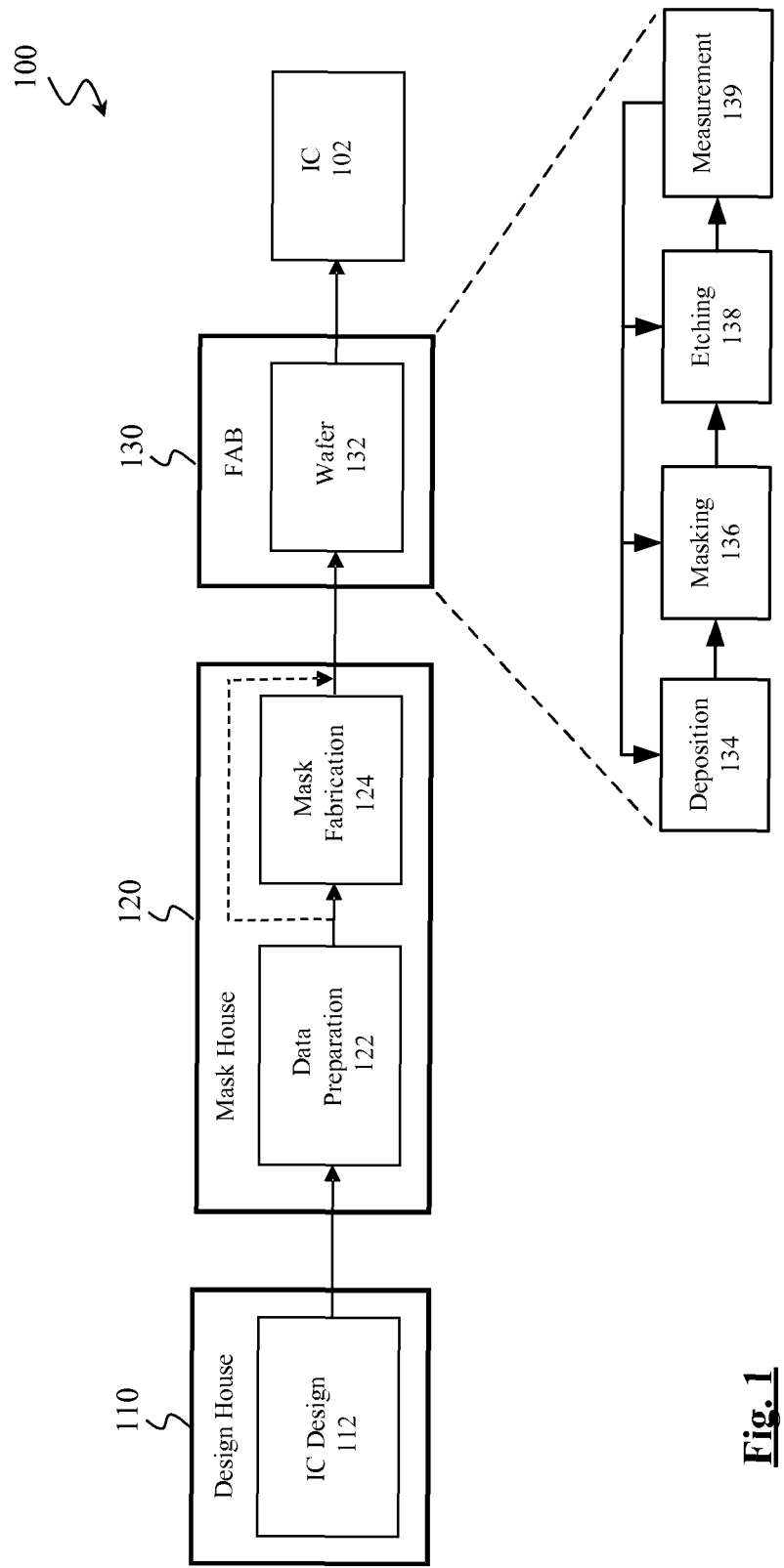
FIG. 1 is an overview diagram of semiconductor manufacturing system and associated operations.

These drawings may be better understood by reference to the following detailed description.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a simplified block diagram of an embodiment of a semiconductor or IC manufacturing system 100 for producing integrated circuits (ICs) and an IC manufacturing flow associated with the manufacturing system. The manufacturing system 100 may produce a plurality of ICs, such as the exemplary IC device 102. The IC manufacturing system 100 includes a plurality of entities, such as a design house (or design team) 110, a mask house (or mask team) 120, and an IC manufacturer (or fab) 130, that interact with one another in the design, development, and manufacturing cycles and/or services related to manufacturing an integrated circuit (IC) device 102. The plurality of entities are connected by a communications network, which may be a single network or a variety of different networks, such as a private intranet and/or the Internet, and may include wired and/or wireless communication channels. Each entity may interact with other entities and may provide services to and/or receive services from the other entities. One or more of the design house 110, the mask house 120, and the fab 130 may be owned by a single larger company, and may even coexist in a common facility and use common resources.

The design house 110 generates an IC design layout 112. The IC design layout 112 includes various geometrical patterns designed for an IC product, based on a specification of the IC product to be manufactured. The geometrical patterns correspond to patterns of metal, oxide, or semiconductor layers that make up the various components of the IC device 102 to be fabricated. The various layers combine to form various IC features. For example, a portion of the IC design layout 112 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 110 implements a proper design procedure to form the IC design layout 112. The design procedure may include logic design, physical design, and/or place and route. The IC design layout 112 is presented in one or more data files having information of the geometrical patterns. For example, the IC design layout 112 can be expressed in a GDSII file format and/or DFII file format.

The mask house 120 uses the IC design layout 112 to manufacture one or more masks to be used for fabricating the various layers of the IC device 102 according to the IC design layout 112. The mask house 120 performs data preparation 122, where the IC design layout 112 is translated into a form that can be physically written by a mask writer, and mask fabrication 124, where the design layout prepared by the data preparation 122 is modified to comply with a particular mask writer and/or mask manufacturer and is then fabricated. In the present embodiment, data preparation 122 and mask fabrication 124 are illustrated as separate elements, however, data preparation 122 and mask fabrication 124 can be a combined element collectively referred to as mask data preparation.

Data preparation 122 includes an optical proximity correction (OPC) process, a mask rule check (MRC) and a lithography process check (LPC). OPC uses lithography enhancement techniques to compensate for image errors, such as those that can arise from diffraction, interference, or other process effects. OPC may add assist features, such as scattering bars, serif, and/or hammerheads to the IC design layout 112 according to optical models and/or rules such that, after a lithography process, a final pattern on a wafer is improved with enhanced resolution and precision. OPC may employ model-based correction and/or rule-based correction. Data preparation 122 may include further resolution enhancement techniques, such as off-axis illumination, sub-resolution assist features, phase-shifting masks, other suitable techniques, and/or combinations thereof. If a mask is to be fabricated, MRC may be invoked to check the IC design layout 112 that has undergone one or more OPC processes with a set of mask creation rules which may contain certain geometric and connectivity restrictions to ensure sufficient margins and to account for variability in semiconductor manufacturing processes. The MRC may modify the IC design layout 112 to compensate for limitations during mask fabrication 124.

LPC simulates lithography processing that will be implemented by the fab 130 to fabricate the IC device 102. LPC simulates this processing based on the IC design layout 112 to create a simulated manufactured device, such as the IC device 102. In an embodiment, LPC determines what shape a hypothetical photomask having a feature modified by OPC and MRC processing would produce on a wafer if the photomask was exposed by a lithography tool described by the LPC models (or rules). A simulated shape is called a contour. The simulated manufactured device includes simulated contours of all or a portion of the IC design layout 112. The LPC models (or rules) may be based on actual processing parameters of the fab 130. The processing parameters can include parameters associated with various processes of the IC manufacturing cycle, parameters associated with tools used for manufacturing the IC, and/or other aspects of the manufacturing process. LPC takes into account various process performance factors, such as intensity log slope (ILS), depth of focus (DOF), mask error enhancement factor (MEEF), data error enhancement factor (DEEF) in a maskless lithography, other suitable factors, and/or combinations thereof.

After a simulated manufactured device has been created by LPC, if the simulated device is not close enough in shape to satisfy design rules, certain operations in data preparation 122, such as OPC and/or MRC operations, may be repeated to refine the IC design layout 112 further. It should be understood that the above description of data preparation 122 has been simplified for the purposes of clarity. In that regard, data preparation 122 may include additional features such as a logic operation (LOP) to modify the IC design layout according to manufacturing rules and/or a Resolution Enhancement Technology (RET) to modify the IC design layout to compensate for limitations in lithography processes used by the fab 130. Additionally, the processes applied to the IC design layout 112 during data preparation 122 may be executed in a variety of different orders. Data preparation 122 thus modifies the design layout 112 suitable for later operations in the IC manufacturing system 100. The results from data preparation 122 are represented in one or more data files, such as a file in a GDSII file format or DFII file format.

After data preparation 122 and during mask fabrication 124, a mask or a group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies. For example, the mask pattern may include opaque regions and transparent regions, or the mask pattern may include reflective regions and absorptive regions. In an embodiment, radiation, such as extreme ultraviolet (EUV) light, is used to expose the image sensitive material layer (e.g., photoresist) coated on a wafer. The light is reflected by the reflective regions and absorbed by the absorptive regions. In the phase shift mask (PSM), various features in the pattern formed on the mask are configured to have proper phase difference to enhance the resolution and imaging quality. In various examples, the phase shift mask can be attenuated PSM or alternating PSM as known in the art. In an embodiment, the mask is an extreme ultraviolet (EUV) mask which is a reflective mask in that some portions of its top surface reflect radiation projected thereon in forming an aerial image of IC patterns to be printed on a target, such as a wafer. The EUV mask may incorporate resolution enhancement techniques such as phase-shifting mask (PSM) and/or optical proximity correction (OPC). After a mask is formed, mask fabrication 124 may include operations to ensure quality of the mask and to gather information for enhancing the mask fabrication process.

The fab 130, such as a semiconductor foundry, uses the mask (or masks) fabricated by the mask house 120 to fabricate the IC device 102. The fab 130 is an IC fabrication business that can include a myriad of manufacturing facilities for the fabrication of a variety of different IC products. In the present embodiment, a semiconductor wafer 132 is processed using the mask (or masks) to form the IC device 102. Many different processes may be undertaken within the fab 130 to produce the IC device 102. As illustrated, these processes include deposition 134, masking 136, and etching 138, and measurement 139. Using these processes repeatedly and in various combinations material layers are formed and patterned to create the IC device 102. Masking layers formed on the IC device 102 during processing may be used to etch and shape underlying layers and may also facilitate in ion implantation for active areas that form individual transistors, capacitors, resistors, etc. After a semiconductor wafer 132 is exposed with the mask, the fab 130 may performs additional operations to ensure quality of the wafer 132 production by checking the patterned photoresist layer. For example, the fab 130 may inspect the wafer 132 for imperfections, as part of measurement 139, in view of the modified IC design layout produced by data preparation 122. Tolerances may be determined for a particular process such that, a deviation from the modified IC design layout is permissible if within the tolerances.

Figure 2:
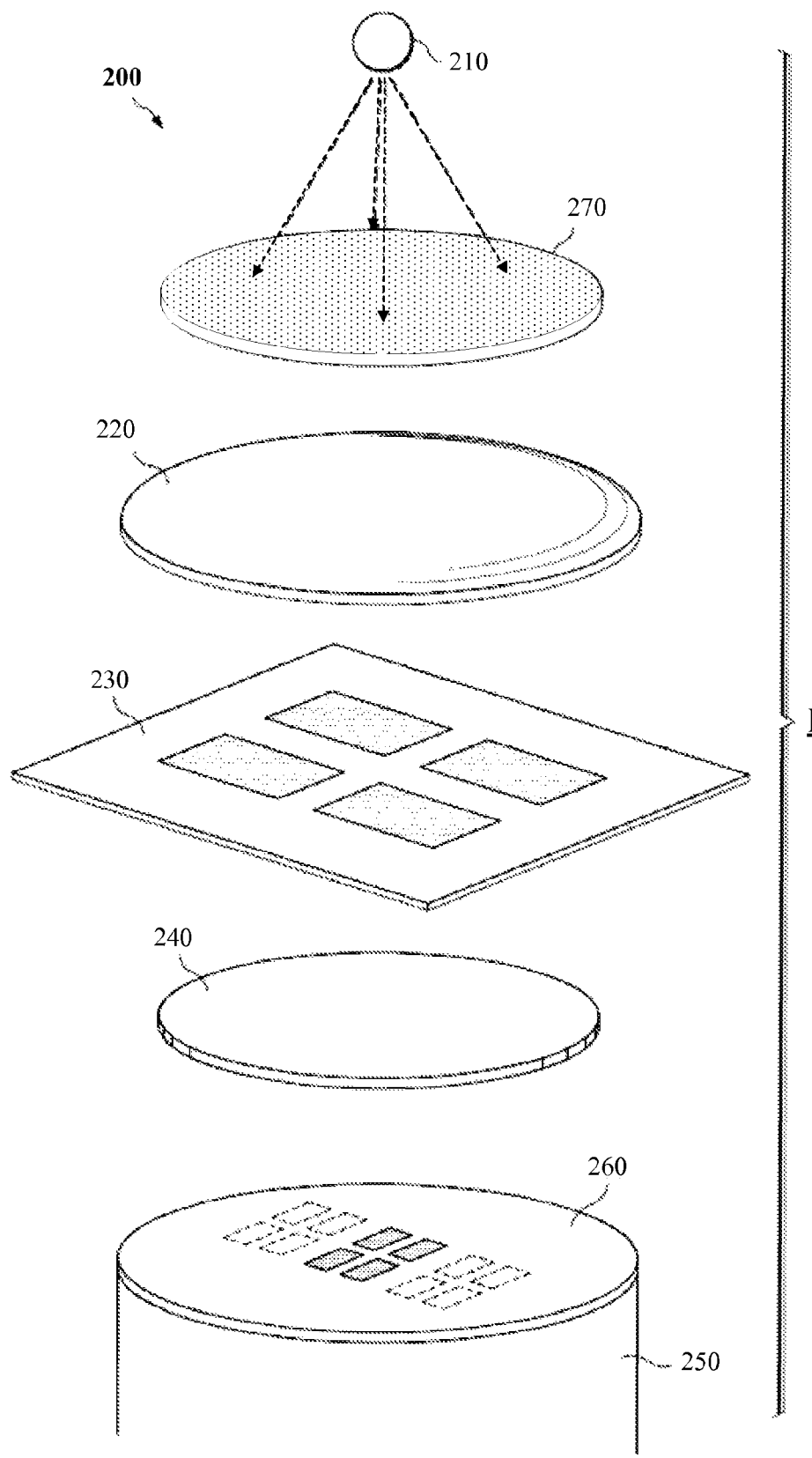
FIG. 2 is a perspective view of an illumination path in a lithography system according to aspects of the present disclosure.

FIG. 2 describes an embodiment of a lithography system 200 that benefits from one or more embodiments of the present invention. For example, the exemplary lithography system 200 can be included in embodiments of the fab 130. The lithography system 200 includes a radiation source (or light source) 210 that begins an illumination path from the source 210 and leads to a wafer. The radiation source 210 may be any suitable light source, such as a Krypton Fluoride (KrF) excimer laser with wavelength of 248 nm; an Argon Fluoride (ArF) excimer laser with a wavelength of 293 nm; a Fluoride ($F_2$) excimer laser with a wavelength of 257 nm; or other light sources having a desired wavelength (e.g., below approximately 200 nm). The radiation source 210 may include an optical source selected from the group consisting of ultraviolet (UV) source, deep UV (DUV) source, extreme UV (EUV) source, and X-ray source. The radiation source may alternatively include a particle source selected from the group consisting of electron beam (E-Beam) source, ion beam source, and plasma source.

The lithography system 200 also includes an illumination system 220. Shown in a simplified form in FIG. 2, the illumination system 220 may comprise refractive optics, such as a single lens or a lens system having multiple lenses and reflective optics, such as mirrors. For example, the illumination system 220 may include microlens arrays, shadow masks, and/or other structures designed to aid in directing light from the radiation source 210 onto a photomask. In some instances, only certain orders of diffracted light may be passed through the lens or lenses due to the angle of diffraction.

The lithography system 200 receives and uses a photomask (also referred to as a mask or a reticle) 230. The photomask 230 can be a transparent mask or a reflective mask. A transparent mask includes a transparent substrate and a patterned absorption layer. A light beam may be partially or completely blocked when directed on an absorption region. The absorption layer may be patterned to have one or more openings through which a light beam may travel through (for a transparent mask) or reflect from a reflective region (for a reflective mask). The photomask 230 may incorporate other resolution enhancement techniques such as phase shift mask (PSM) and/or optical proximity correction (OPC), which will be described in further detail later below.

The lithography system 200 also includes a projection system 240. Shown in a simplified manner, the projection system 240 may have refractive optics or reflective optics. The projection system 240 directs the patterned radiation to a target.

The lithography system 200 may further include a substrate stage 250 capable of securing and moving a target wafer 260 in translational and rotational modes such that the substrate may be aligned with the photomask 230. The target wafer 260 may be a semiconductor wafer comprising an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or any combination thereof. The target wafer 260 may also have a photoresist coating layer formed thereon during the lithography process. The photoresist coating layer may be chemically altered by exposure to the light or radiation from the radiation source 210, such that it hardens or softens on exposure to the light.

The lithography system 200 also includes an illuminator 270 having a plurality of radiation-transmitting regions (or illumination poles) to transmit radiation energy from the radiation source 210. The regions may be positioned within a radiation blocking field. The illuminator 270 may be positioned between the radiation source 210 and the illumination system 220 in the lithography system 200. The plurality of radiation-transmitting regions of the illuminator 270 may be defined along radial axis perpendicular to the optical axis. Each radiation-transmitting region is designed to transmit radiation with an adjustable intensity and is operable to provide asymmetric illumination.

Additionally or alternatively, each radiation-transmitting region of the illuminator 270 may be designed to transmit radiation with an adjustable phase (radiation wave phase), polarization (radiation wave polarization), or combinations thereof. Each radiation-transmitting region of the illuminator 270 may be designed to be in various shapes, sizes, and/or be disposed away from the optical axis for off-axis illumination. The plurality of radiation-transmitting regions of the illuminator 270 may be designed to be separate from each other or contacting each other to form a continuous area.

The plurality of radiation-transmitting regions of the illuminator 270 may be further designed to have various radiation intensities, radiation wave phases (such as optical phase), radiation polarizations (such as optical polarization), or combinations thereof utilized by various methods and materials including but not limited to: glass with a tunable tilt angle; multicoated glass with predefined transmittance; two optical polarizers stacked with a specific angle between polarizing directions thereof; liquid crystal sandwiched between two polarizers (parallel or orthogonal) controllable to tune intensity, phase, polarization, or combinations thereof when properly integrated with electrodes; or controllable radiation-blocking mechanisms having various structures such as a window blind structure or a camera shutter.

The lithography system 200 may also include other techniques and/or components. For example, the lithography system may include components and mechanisms to implement an immersion lithography process.

Figure 3A:
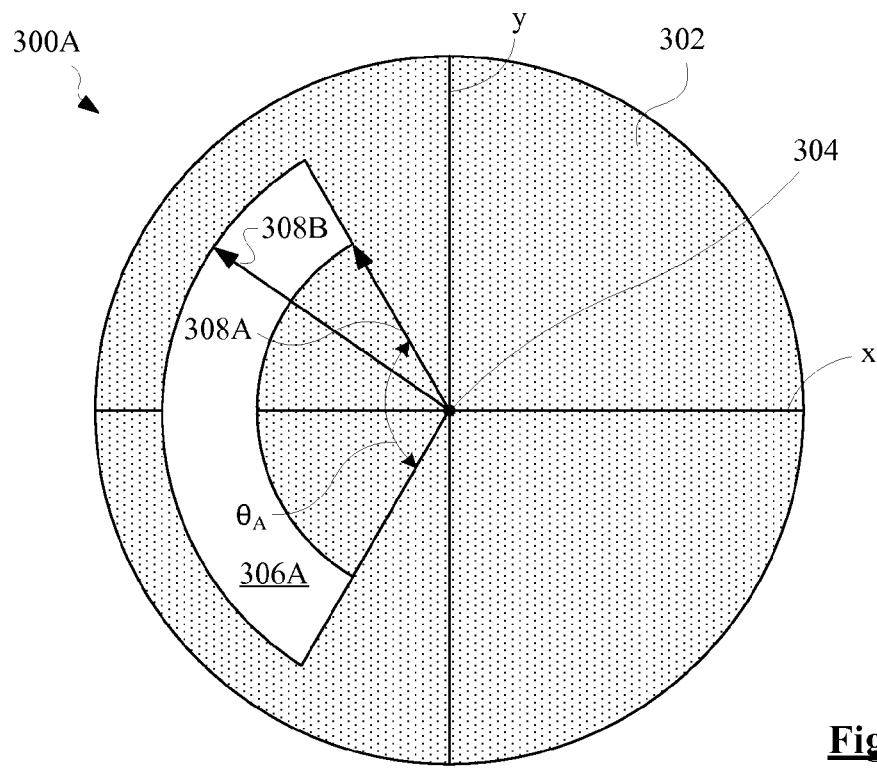
FIGS. 3A and 3B are top view diagrams of illuminators that may be used in the illumination path of FIG. 2, according to aspects of the present disclosure.
Figure 3B:
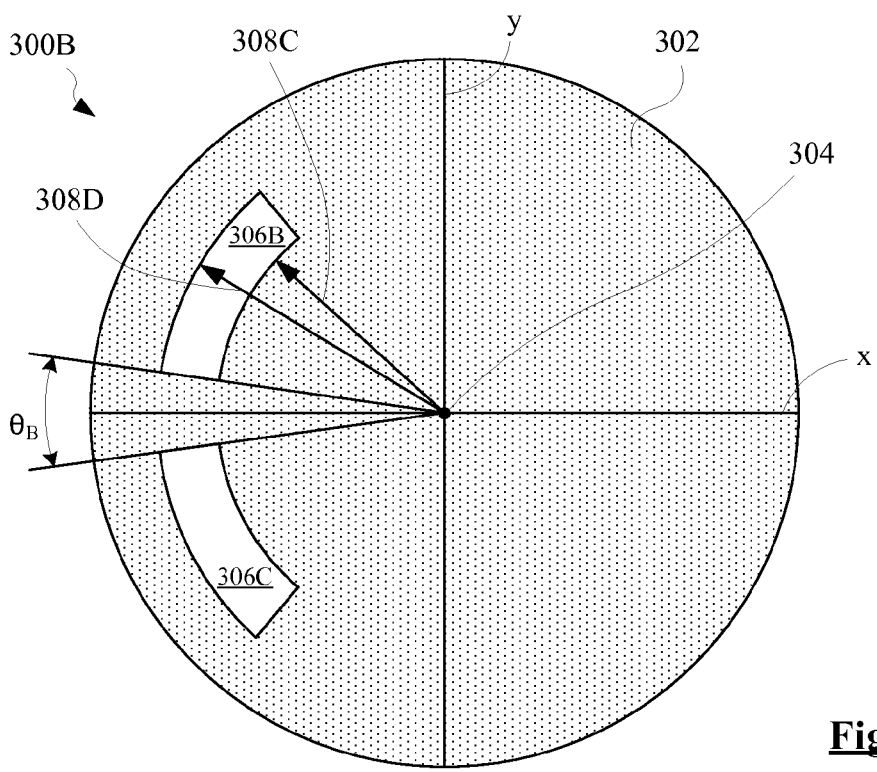

Referring to FIGS. 3A and 3B, illustrated are diagrammatic representations of exemplary embodiments of an illuminator that may be used to provide the illuminator 270 of FIG. 2. The illustrated embodiments are designated as illuminator 300A and illuminator 300B in FIGS. 3A and 3B, respectively. In some embodiments, illuminators 300A and 300B may be used during a focus monitoring or measurement process that is different from a standard production lithography process. The illuminator 300A includes a plate 302 being opaque to the radiation so that the radiation illuminating on the plate 302 will be blocked thereby from transmitting through. The plate 302 may be made of a metal, metal alloy, and/or other materials having opaque properties. The plate 302 may include proper coating materials. The plate 302 may have a circular perimeter defining a center 304, to be aligned with the optical axis of the lithography system 200 during a lithography process.

The illuminator 300A further includes an asymmetric radiation-transmitting region 306A. As shown in FIG. 3A, the radiation-transmitting region 306A is symmetric about an x-axis, but asymmetric about the y-axis, such that there is no corresponding radiation-transmission in a right half of the illuminator 300A, as seen in FIG. 3A. The x-axis and y-axis are perpendicular to each other. As shown in FIG. 3A, the radiation-transmitting region 306A is a portion of a ring centered about the center 304. Ring-portion embodiments of the radiation transmitting region 306A may be characterized as having an inner radius 308A and an outer radius 308B. A difference between the inner radius 308A and the outer radius 308B may be referred to as a thickness of the radiation transmitting region 306A. As shown, the radiation transmitting region 306A is further characterized by an angle $\theta_A$.

The illuminator 300B of FIG. 3B includes multiple radiation transmitting regions. While the illuminator 300B is depicted as including two radiation-transmitting regions, other embodiments of the illuminator 300 may include three or more radiation-transmitting regions. The illuminator 300B includes a first radiation transmitting region 306B and a second radiation transmitting region 306C. As illustrated, the radiation transmitting region 306B may be characterized by an inner radius 308C and an outer radius 308D, which define a thickness of the radiation transmitting region 306C. The illuminator 300B may be symmetric about the x-axis such that features of the radiation transmitting region 306B mirror the features of the radiation transmitting region 306C about the x-axis. As shown, the illuminator 300B is asymmetric about the y-axis such that there are no radiation transmitting regions in the right half of the illuminator 300B that correspond to the radiation transmitting regions 306B and 306C. The radiation transmitting regions 306B and 306C are separated by an angle $\theta_B$.

Each radiation-transmitting region may be made of a transparent or translucent material, an opening, or an opening covered with a transmitting material such as glass, liquid crystal, polarizers, or combinations thereof, to utilize an adjustable transmittance. In some embodiments of the illuminators 300A and 300B, the portions illustrated as radiation transmitting regions may instead be radiopaque regions, while the portions illustrated as being radiopaque may be radiation transmitting regions. In addition to the ring-portion shapes of the radiation-sensing regions of FIGS. 3A and 3B, other embodiments of the radiation-transmitting regions of other embodiments of the illuminator 300 may be defined in various shapes such as square, trapezoid, circular, or other shapes and may include notches or other deviations from a basic shape. The radiation-transmitting regions may be made of a transparent or translucent material, an opening, or an opening covered with a transmitting material such as glass, liquid crystal, polarizers, or combinations thereof, to utilize an adjustable transmittance.

The described illuminators 300A and 300B and other illuminators described herein may be used for monitoring the focus of the lithography system 200. For example, the illuminator 300A may be positioned within the lithography system 200 in order to pattern one or more test wafers or to pattern one or more production wafers with a test pattern. In some embodiments, the test pattern includes a plurality of parallel line features as shown in FIG. 4.

Figure 4:
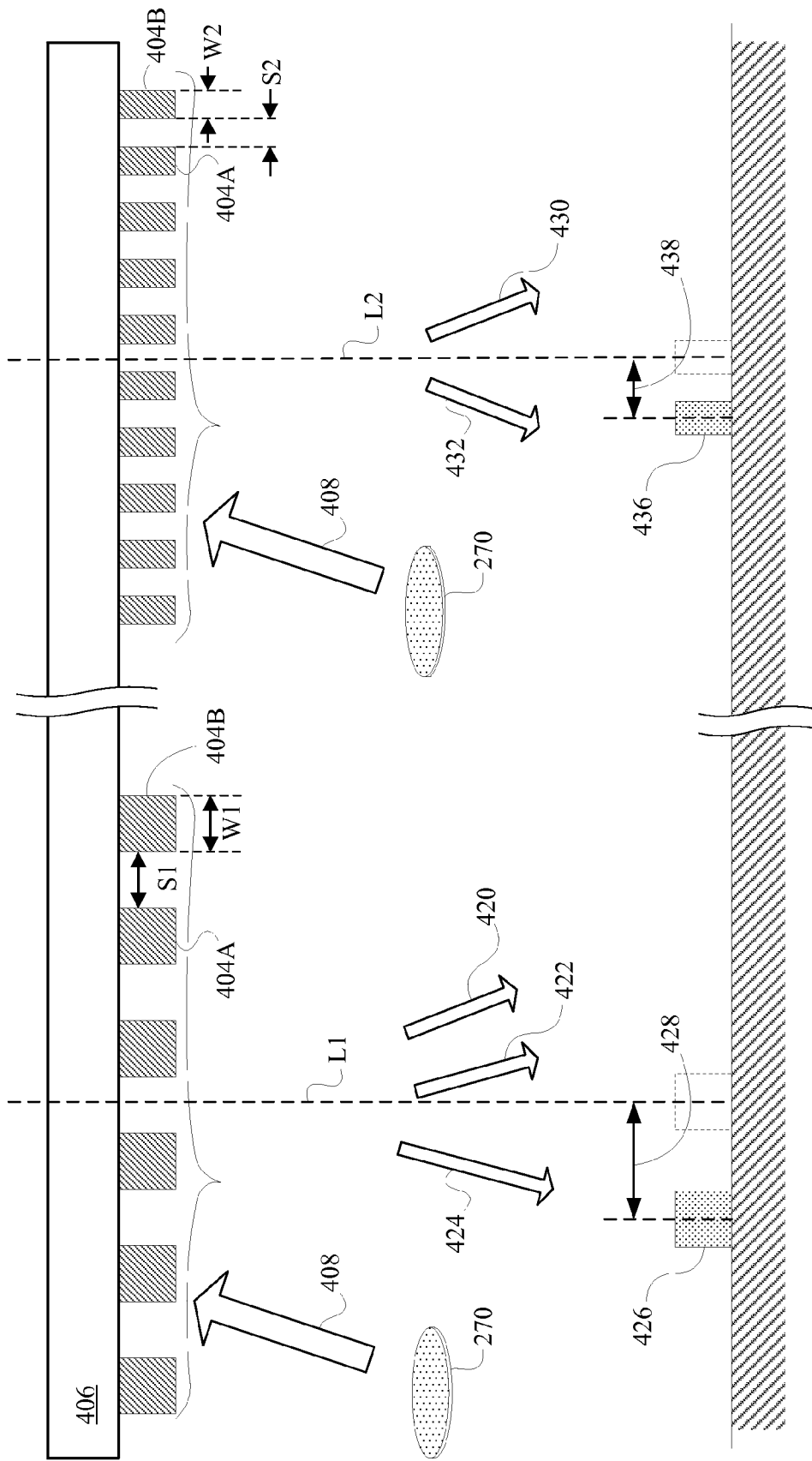
FIG. 4 is a cross-sectional diagram of wafer exposure according to aspects of the present disclosure.

Referring now to FIG. 4, shown therein is a wafer 400 undergoing a pattern process to pattern a photoresist layer. In some embodiments, a production wafer may be used; while in other embodiments, a test wafer is used to monitor the focus of the lithography system used in patterned the photoresist layer. FIG. 4 shows a photomask 402 having a first pattern 404 on a portion thereof. The photomask 402 may be an EUV photomask that includes reflective portions and absorptive portions. For example, the photomask 402 may include a multilayer stack formed over a mask substrate. Overlying the multilayer stack is a patterned absorber layer that includes the first pattern 404. Other layers, such as a capping layer, may be included to improve the performance of the photomask 402. As shown in FIG. 4, a bulk portion 406 of the photomask 402 includes the mask substrate and the multilayer stack. The first absorber pattern 404 is formed thereover, which includes a plurality of absorber pattern features, 404A, 404B, and others.

The absorber pattern 404 has a 1:1 line-space ratio. In other words, a line width W1 of the absorber pattern feature 404B (and the other pattern features in pattern 404) may be approximately equal to a line spacing S1 defined between the absorber pattern feature 404A and the absorber pattern feature 404B (and between the other pattern features of pattern 404). Thus, the other absorber pattern features of the absorber pattern 404 may be substantially equal in width to the width W1 of absorber pattern feature 404B, and the spacing between the absorber pattern features of the absorber pattern 404 may be substantially equal to the spacing S1 between the absorber pattern features 404A and 404B. Thus, the pattern 404 is a substantially uniform pattern.

The absorber layer of the photomask 402 also includes a second absorber pattern 414, which also has a line-space ratio of 1:1. However, the pitch of the second absorber pattern 414 is different than the pitch of the pattern 404. Like the pattern 404, the pattern 414 includes a plurality of absorber pattern features, including pattern features 414A and 414B. The width of the pattern features 414A and 414B (and other pattern features in the pattern 414) is W2, while the spacing between the features 414A and 414B (and between other pattern features in the pattern 414) is S2. While S1 is equal to W1 and S2 is equal to W2, S1 is not equal to S2 and W1 is not equal to W2. For example, in some embodiments of the photomask 402, S1 and W1 are equal to about 65 nanometers, while S2 and W2 are equal to about 32 nanometers. Other pitch combinations of S1/W1 and S2/W2 may be provided in other embodiments. For example, the first pitch (i.e., the pitch of pattern 404) may be 60 nanometers in other embodiments. The second pitch (i.e., the pitch of pattern 414) may be 40 nanometers in other embodiments, and 50 nanometers in yet other embodiments. Combinations of the first pitch and second pitch include but are not limited to: (32 nm, 60 nm), (40 nm, 60 nm), (40 nm, 65 nm), (50 nm, 60 nm), and (50 nm, 65 nm). The first and second patterns 404 and 414 may be portions of a box-in-box test structure pattern, in which the first pattern 404 surrounds the second pattern 414, which may each include a plurality of concentric rectangles or other structures.

When the incident light 408 interacts with the photomask 402, the interactions with the patterns 404 and 414 produce different diffraction orders that reflect off the patterned surface of the photomask 402. The pattern 404 and the pattern 414 each interact with the incident light 408 such that different reflected or diffracted orders of light are used to reproduce pattern 404 and pattern 414 on the wafer 400. As illustrated in FIG. 4, the S1-W1 pattern 404 produces a zero-order reflection 420, a first negative order peak 422, and a second negative order peak 424. In the illustrated embodiment, higher orders (higher than the second order) may not be passed through the lens or lenses present between the photomask 402 and the underlying wafer 400 that is being patterned, due to the higher angle of these higher orders.

The incident light 408 is provided with an asymmetric illuminator 270 from the illumination system 200, such as the illuminators 300A and 300B. While two illuminators 270 are shown in FIG. 4, only one illuminator is used to provide the incident light 408, which interacts with both patterns 404 and 414. Because the incident light 408 is asymmetric and because of the larger pitch of the pattern 404, the zero-order reflection and first negative order peak 422 have a similar angle. Additionally, the second negative order peak 424 has little to no energy compared with the zero-order reflection and the first negative order peak 422. When the pattern 404 is replicated on the wafer 400, in a photoresist layer thereon, there is a pattern shift produced. As illustrated in FIG. 1, an exemplary photoresist feature 426 is shown on the surface of the wafer 400. The asymmetric light from the reflection 420 and the first and second negative orders 422 and 424 cause a first shift 428 to occur to the feature 426, such that it is shifted relative to an ideal position. That is, dashed line L1 represents where photoresist feature may have been formed had a conventional illumination process, using a symmetric illuminator been used (also shown with a dashed line box). While a certain amount of pattern shift may occur even with a symmetric illuminator, because of the use of an asymmetric illuminator, the incident light 408 causes the more pronounced shift 428 to occur.

When the incident light 408 interacts with the pattern 414, a zero-order reflection 430 is produce along with a negative first order peak 432. Unlike the diffraction pattern produced by the absorber pattern 404, the zero-order reflection 430 and the negative first order peak 432 are substantially symmetric or at least are comparatively symmetric when compared with the diffraction pattern produced by the absorber pattern 404. The zero-order reflection and the negative first order peak 432 may be directed by a lens or lenses onto the wafer 400 to pattern the exemplary photoresist feature 436. While the pattern 414, like the pattern 404, produces multiple, corresponding photoresist features, only one such feature is shown for clarity. While a pattern shift 438 may be produced that shows that the feature 436 is shifted away from its ideal location (illustrated by dashed line L2 and the dashed box representing an ideal feature location), the pattern shift 438 is smaller than the pattern shift 428, due to the more symmetric illumination produced by the interaction of the pattern 414 and the asymmetric incident light 408 that by the interaction of the pattern 404 and the light 408.

Figure 5:
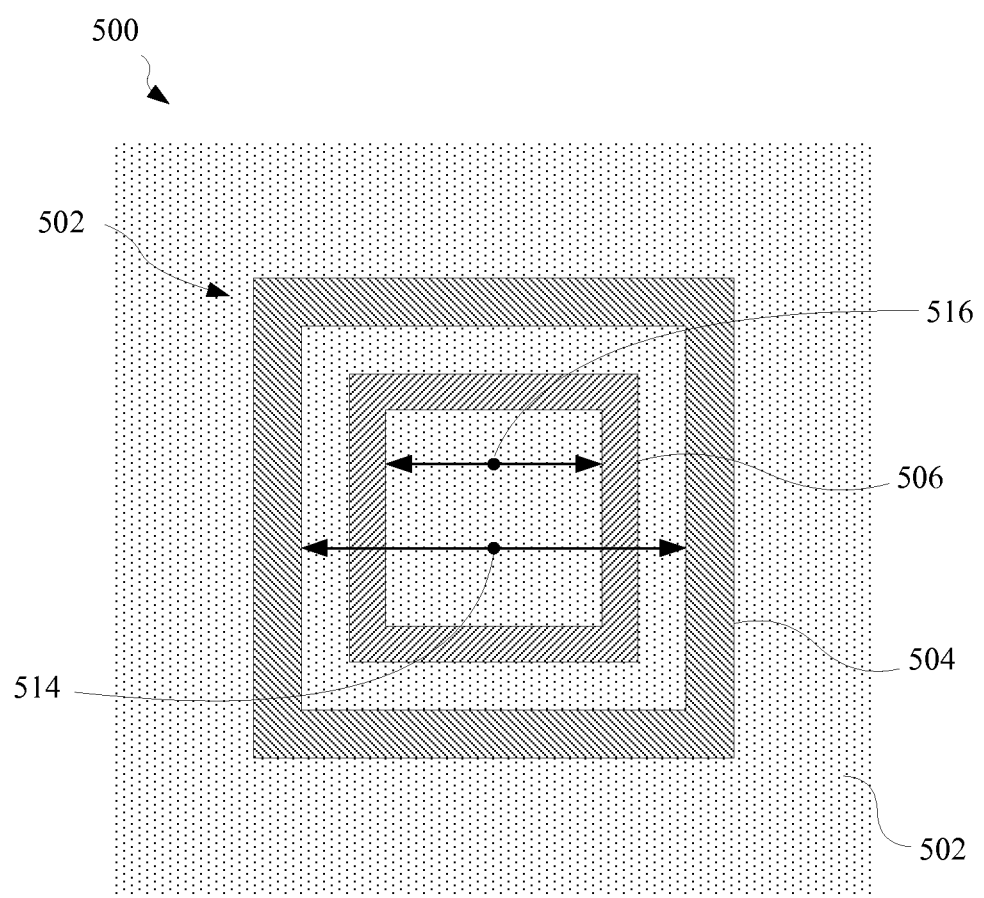
FIG. 5 is a diagram of an exemplary test structure produced on a wafer according to aspects of the present disclosure.

FIG. 5 is diagram of a test structure 502 formed on a wafer 500 as part of a production process or as part of a testing/monitoring process, such as a focus monitoring process to determine whether the light from an EUV source is properly focused when it reaches a photoresist layer on a wafer 500. The wafer 500 may be the same as the wafer 400 of FIG. 4. As shown, the test structure 502 is a box-in-box test structure 502, although other test structures may be used in other embodiments. As illustrated, the test structure 502 includes an outer box 504, which includes a plurality of parallel concentric lines formed in a rectangular shape in the photoresist layer. The test structure 502 further includes an inner box 506, which also includes a plurality of parallel concentric lines formed in a corresponding rectangular shape in the photoresist layer. In some embodiments, the outer box 504 corresponds to the pattern 404 and the inner box 506 corresponds to the pattern 414 described herein in connection with FIG. 4. Thus, a pitch of the concentric lines of the outer box 504 is different than a pitch of the concentric lines forming the inner box 506.

In some embodiments, the inner pitch (e.g., the pitch of the concentric lines forming the inner box 506) may be smaller than the outer pitch (e.g., the pitch of the concentric lines forming the outer box 504). For example, the outer pitch may be about 65 nanometers or about 60 nanometers, while the inner pitch may be about 32 nanometers, 40 nanometers, or 50 nanometers. Embodiments of the test structure 502 may include combinations of inner pitches and outer pitches, such as: 32 nanometers and 60 nanometers, 32 nanometers and 65 nanometers, 40 nanometers and 60 nanometers, 40 nanometers and 65 nanometers, 50 nanometers and 60 nanometers, and 50 nanometers and 65 nanometers. Other pitches may be used in other embodiments of the inner box 506 and the outer box 504, such that other combinations are present in embodiments of the test structure 502.

After the pattern corresponding to the test structure 502 (also referred to as pattern 502) has been formed on the wafer 500, the wafer 500 may be introduced into a metrology tool for measurement. The metrology tool may be used to observe the pattern 502 in order to assess the focus of the lithography system 200 to ensure proper focus. In some embodiments, the metrology tool automatically locates the pattern 502 on the wafer 500 performs measurements thereon. Center measurements may be taken to identify the center of the inner box 506 as well as the center of the outer box 504. The center measurements may be taken from outer edge to outer edge, from inner edge to inner edge, or from middle to middle of each of the outer box 504 and the inner box 506. In some embodiments, the center measurements may be taken along a single line that extends through both the inner box 506 and the outer box 504 is shown in FIG. 5, the center measurements are inner edge to inner edge measurements. Once the center point 514 and the center point 516 have been identified, a difference between the center point 514 and the center point 516 may be determined. The difference between the center points 514 and 516 may be used to determine an adjustment to the focus of the lithography system 200. In other embodiments, the difference between the inner edge of the outer box 504 and the closest inner edge of the inner box may be used to identify a shift difference between the boxes 504 and 506. As described above in connection with FIG. 4, the outer box 504 (or whichever box has the larger pitch) may experience the larger shift.

Figures 6A, 6B:
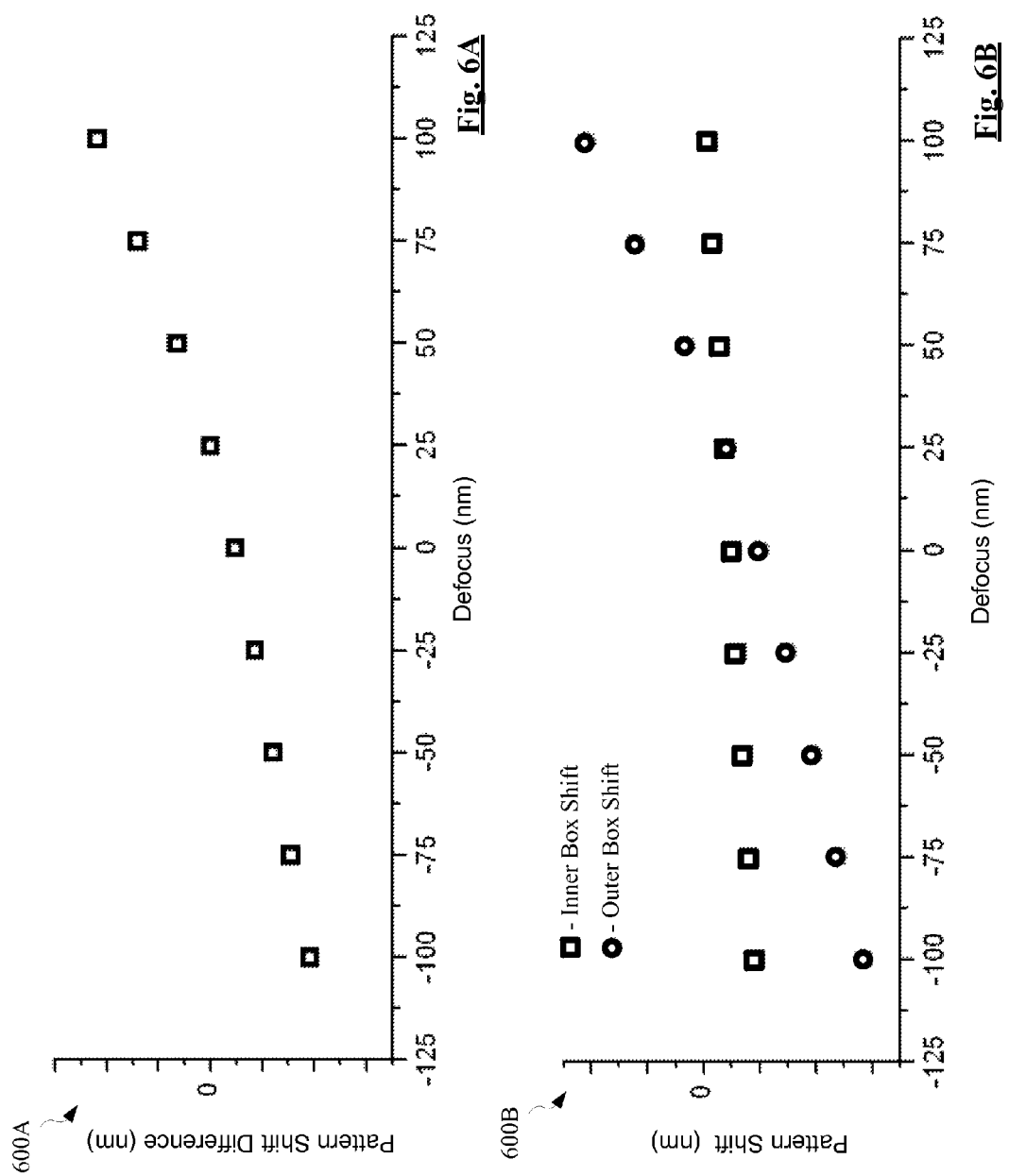
FIG. 6A is a plot illustrating the difference in pattern shift between two components of the exemplary test structure of FIG. 5, according to aspects of the present disclosure.
FIG. 6B is a plot of a simulation of the pattern shift of each of the two components of the exemplary test structure of FIG. 5, according to aspects of the present disclosure.

Referring now to FIGS. 6A and 6B, shown therein are plots that represent measured or simulated aspects of the pattern shifts associated with patterns 404 and 414 (FIG. 4) or with the outer box 504 and the inner box 506 (FIG. 5). The plot 600A includes exemplary measurements reflecting the difference between the center point 514 and center point 516 of FIG. 5. This measured data may be obtained from the metrology tool, which may be operated manually by an operator or may be operated automatically by a computerized metrology tool. The x-axis of the plot 600A includes the defocus, measured in nanometers and ranging from about −125 nanometers to about +120 nanometers. The y-axis of the plot 600A includes the measurement of the pattern shift difference in nanometers, which includes positive and negative data. For example, the y-axis may range from about −20 nanometers to about +20 nanometers. While the pattern shifts of the outer box 504 and inner box 506 may not be independently measureable from the wafer 500, the difference between the shift of the outer box 504 and the shift of the inner box 506 is measureable and is measured with the metrology tool.

Based on the measured pattern shift difference included in the plot 600A, a simulation may be performed based on the measured difference, the geometries of the absorber patterns 404 and 414 (based on the design layout or on the actual photomask 402), and other aspects of the lithography system 200, to generate estimated individual pattern shifts for the outer box 504 and the inner box 506. These estimated or simulated individual pattern shifts may be plotted in the plot 600B, which includes x- and y-axes that are substantially the same as those of plot 600A.

Either or both of the plots 600A and 600B may provide a relationship between defocus and the box-in-box shift difference. For example, an implementation of the present disclosure determines that, in one case, for a defocus of about 10 nanometers, the box-in-box difference was about 1 nanometer and for a defocus of about 5 nanometers, the box-in-box difference was about 0.5 nanometers. This indicates a sensitivity of about 0.1 box-in-box difference nanometers per nanometer of defocus. The sensitivity may be determined by a computing system, such as the computer system 800 described herein below and may be used to adjust the lithography system 200. For example, if a box-in-box measurement is taken (or many box-in-box measurements are taken and statistically combined) on a first day during production and another box-in-box measurement (or measurements) are taken on a second day (not limited to the following calendar day) a difference may be observed that indicates a change in focus of the lithography system 200 that may require adjustment. In some embodiments, a technician may use the data obtained based on the box-in-box measurements to perform an adjustment manually, while in other embodiments, the adjustment may be performed automatically based on the box-in-box measurements. For example, if a shift is observed in a positive direction, a corresponding change to the focus of the lithography system 200 in the opposite direction may be performed manually or automatically. Further, because the sensitivity is sufficient high, the computing system may provide a linear fit between the measured values and the simulated values used in performing the correction to the focus when the focus is determined to be unsatisfactory.

Figure 7:
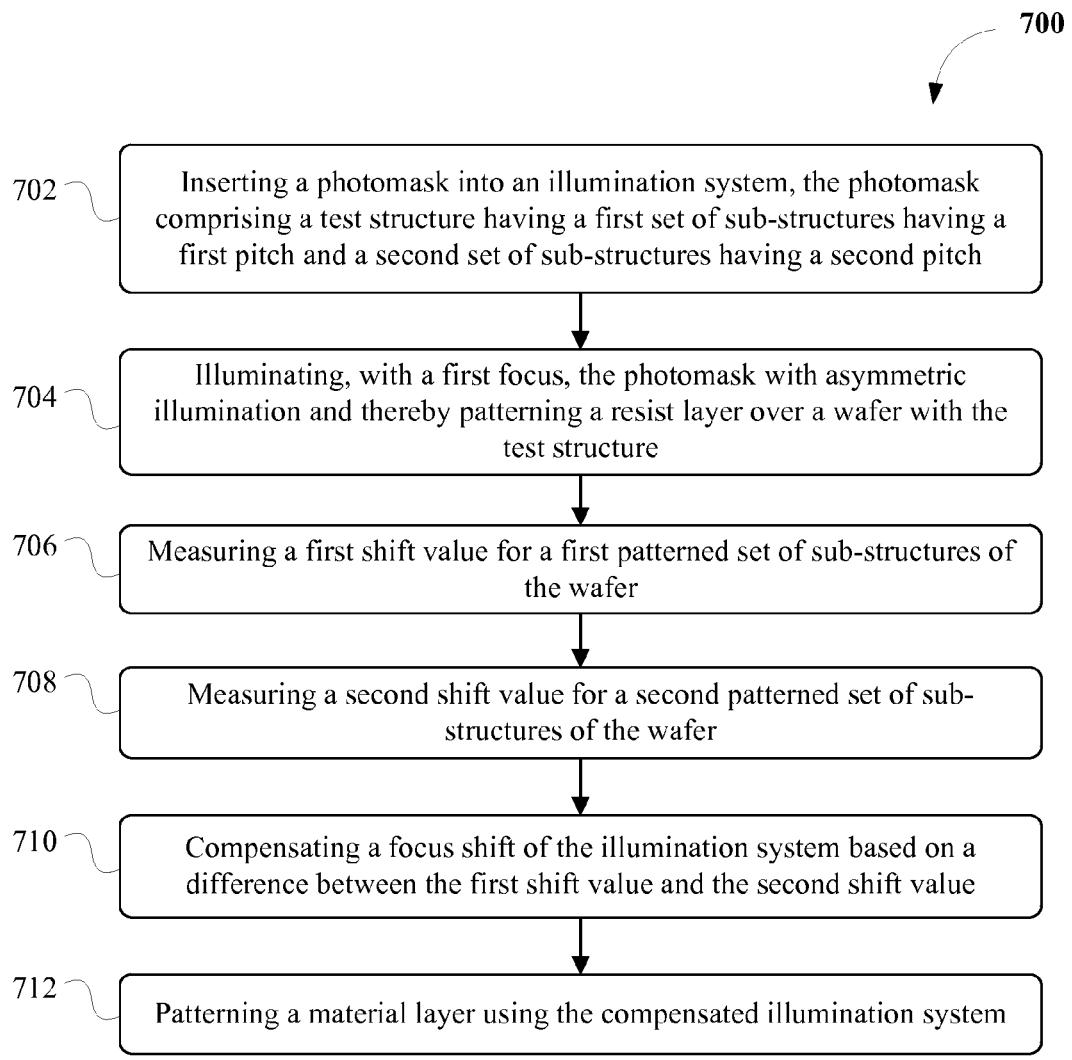
FIG. 7 is a flow chart of a method of monitoring focus in an illumination system according to aspects of the present disclosure.

Referring now to FIG. 7, shown therein is a method 700 for monitoring and/or correcting the focus of lithography system, like the lithography system 200 of FIG. 2. As illustrated in FIG. 7, the method 700 includes a plurality of enumerated steps or operations. Embodiments of the method 700 may include additional steps or operations before, after, in between, or as part of the enumerated operations. Embodiments of the method 700 may be performed within the context of the IC manufacturing system 100 illustrated in FIG. 1 and described herein. In particular, the method may be performed within the fab 130. Additionally, some embodiments of the method 700 may be provided as a set of instructions stored on a computer readable storage medium and executable by one or more processors.

An embodiment of the method 700 may begin at operation 702 in which a photomask is inserted into an illumination system for a photolithography process. The photomask may include a test structure having a first set of sub-structures having a first pitch and a second set of sub-structures having a second pitch, wherein the first pitch is greater than the second pitch. For example, the photomask may be similar to the photomask 402 which includes a first absorber pattern 404 and a second absorber pattern 414 as described herein. In some embodiments, the pattern 404 may have a pitch of about 65 nm while the pattern 414 has a pitch of about 32 nm. The first set of sub-structures may correspond to the outer box 504 such that the absorber pattern 404 includes a plurality of concentric rectangles having a line-space ratio of 1:1. The second set of sub-structures may similarly correspond to the inner box 506.

At operation 704, the photomask is illuminated with asymmetric illumination, and thereby patterning a resist layer over a wafer with the test structure. The asymmetric illumination may be performed with a first focus setting. For example, the photomask 402 may be used with the lithography system 200 having an illuminator like the illuminators 300A and 300B. The asymmetry of illumination may result in the pattern shifts measured subsequently. The wafer is exposed to form a corresponding test structure with a first patterned set of sub-structure and a second patterned set of sub-structures on the wafer. The wafer may be exposed, developed, and hard baked in order to fully pattern the test structure on the wafer. After patterning, the wafer may be removed from the lithography system 200 and transported to a metrology tool for measurement.

At operation 706, a first shift value is measured for the first patterned set of sub-structures on the wafer, and at operation 708, a second shift value is measured for the second patterned set of sub-structures on the wafer. The first and second patterned set of sub-structures may be the outer box 504 and the inner box 506 of the test structure 502 of the wafer 500 of FIG. 5, which includes pluralities of concentric rectangles. In some embodiments, the sub-structures may not be enclosed structures, but may be linear structures or other structures that include a line-space ratio of 1:1.

At operation 710, a focus setting of the illumination system is modified based on a difference between the first shift value and the second shift value. In other words, a focus shift of the illumination shift is compensated for based on the difference between the first shift value and the second shift value. For example, the focus setting may be increased or decreased according to the difference to adjust or correct for the focus shift. In some embodiments, the metrology tool used to measure the first and second shift values may also calculate a difference between the first and second shift values. The difference may be used to determine the degree to which the focus setting should be adjusted. The degree to which the focus setting or focus shift should be adjusted may be provided to a technician who may manually adjust the focus of the illumination system. In some embodiments, the metrology tool may communicate the adjustment directly to the illumination system or through a network. In such embodiments, the illumination system may receive the adjustment and automatically perform the adjustment to correct the focus of the system.

At operation 712, a material layer may be patterned using the modified focus setting of the illumination system or using the compensated focus shift of the illumination system. For example, the material layer may be on a production wafer and may form components of an integrated circuit during an IC manufacturing process.

In some embodiments, multiple test wafers are run through the metrology tool to measure the first and second shift values on a plurality of wafers. These values may be statistically processed in order to determine an appropriate adjustment to the focus setting of the illumination system. For example, a mean or a median value may be calculated from the first and second shift values from each of the test wafers. Additionally, the method 700 or a subset of operations may be performed with some regularly, for example one or more test wafers may be processed each day or each week, or at other regular intervals in order to maintain appropriate focus settings. Because the wafers are moved to the metrology tool for testing, the wafers may not cause significant delays in the processing flow of production wafers.

In some embodiments, the method 700 may further includes operations of illuminating, with a second focus, the photomask with asymmetric illumination to pattern a resist layer over an additional wafer. The patterning, the additional wafer may be provided to a metrology tool for measuring a third shift value for a first patterned set of sub-structures of the additional wafer and for measuring a fourth shift value for a second patterned set of sub-structures of the additional wafer. The difference between the third shift value and the fourth shift value may be calculated, and the focus shift may be compensated again based on the difference between the third shift value and the second shift value.

In some embodiments, modifying the focus setting of the illumination system or compensating the focus shift based on the difference between the first shift value and the second shift value may include modifying or adjusting the focus setting of the illumination system based on a plurality of differences between shift values from a plurality of wafers patterned using different focus settings.

Figure 8:
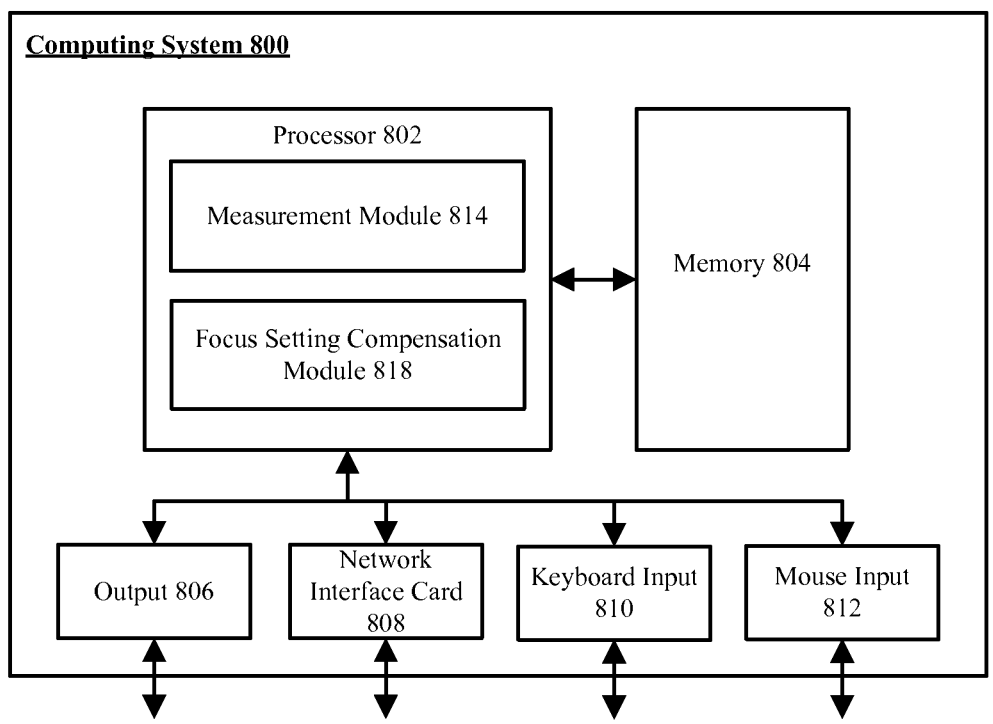
FIG. 8 is a diagram of a computing system according to aspects of the present disclosure.

Referring now to FIG. 8, shown therein is an illumination modification system 800. The system 800 may be used in implementing the method 700 in performing certain operations thereof. As illustrated, the system 800 includes at least one computer processor 802, which may be one or more processors, in communication with a memory 804 such that it is configured to store information in and retrieve information from memory 804. Memory 804 is a tangible, non-transient computer-readable medium, embodiments of which include without limitation RAM or ROM, and instructions stored on other devices (such as hard drives, floppy disks, flash memory, or a CD-ROM, for example). A plurality of input/output mechanisms is provided in the system 800, including an output 806, which may communicate with a display to convey visual information to a user or operator. System 800 includes a network interface card 808 that allows the system 800 to communicate with remote computing and information storage systems or with other systems or components within the fab 130 of FIG. 1. System 800 may also include a keyboard input 810 and a mouse input 812 that allow the operator to interact with the system to enter information and select options. Other inputs and outputs may be included in embodiments of the system 800.

The computer processor 802 provides a plurality of modules that facilitate the measurement and simulation of semiconductor processes, include a measurement module 814 and a focus shift compensation module 818, also referred to as a focus shift setting module 818. Some embodiments of the system 800 may include additional modules. The modules may be provided by the computer processor 802 executing computer-readable instructions stored in the memory 804. In some embodiments, some of the modules are implemented as dedicated hardware devices; while in others, combinations of hardware and software are used to provide the modules.

For example, in some embodiments, the computing system 800 may be the metrology tool described herein. The computing system 800 may use the measurement module 814 to measure a first shift value of a first patterned set of sub-structures of a test structure on a wafer and to measure a second shift value of a second patterned set of sub-structures of the test structure on the wafer. The focus shift compensation module 818 may calculate a difference between the first shift value and second shift value and calculate a focus setting compensation or a focus shift compensation. The modification may be communicated via a user interface to technician and/or may be communicated through the network interface card 808 to the illumination system, which may then automatically implement the focus shift compensation to apply a correction to the focus of the illumination system.

One of the more general aspects of the present disclosure includes a method of correcting a focus of an EUV lithography system. The method may include operations of inserting a photomask into an illumination system and illuminating, with a first focus, the photomask with asymmetric illumination and thereby patterning a resist layer over a wafer with the test structure. The photomask may include a test structure that has a first set of sub-structures having a first pitch and a second set of sub-structures that has a second pitch, wherein the first pitch is greater than the second pitch. The method further includes operations of measuring a first shift value for a first patterned set of sub-structures of the wafer, measuring a second shift value for a second patterned set of sub-structures of the wafer, and compensating a focus shift of the illumination system based on a difference between the first shift value and the second shift value.

Another general aspect of the present disclosure includes a method of monitoring focus of an EUV lithography system. The method may include operations of measuring a first shift value for a first patterned set of sub-structures of a focus test structure on a wafer and measuring a second shift value for a second patterned set of sub-structures of the test structure on the wafer. The test structure may be formed on the wafer using asymmetric illumination, with the first patterned set of sub-structures having a first pitch and the second patterned set of sub-structures having a second pitch that is different from the first pitch. The method may further include determining a focus shift compensation for an illumination system based on a difference between the first shift value and the second shift value.

Yet another general aspect of the present disclosure includes a system for monitoring focus for an EUV lithography process. Such a system may include a lithography system that has an asymmetric illuminator, a photomask, a metrology tool, and a processor configured to determine a focus shift compensation based on a pattern difference. The photomask may include a box-in-box test structure pattern that includes a first pattern surrounding a second pattern, the first pattern having a first pitch that is greater than a second pitch of the second pattern. The metrology tool may be configured to receive a wafer patterned with the photomask such that the wafer includes a box-in-box test structure thereon and measure the pattern shift difference therefrom.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims.

What is claimed is:

1. A method of monitoring focus of an EUV lithography system, the method comprising:
   inserting a photomask into an illumination system, the photomask comprising a test structure having a first set of sub-structures having a first pitch and arranged to define a first box and a second set of sub-structures having a second pitch and arranged to define a second box within the first box;
   illuminating, with a first focus, the photomask with asymmetric illumination and thereby patterning a layer over a wafer with the test structure;
   measuring a first shift value for a first patterned set of sub-structures of the wafer by determining a center point of the first box, wherein the first shift value corresponds to the center point of the first box;
   measuring a second shift value for a second patterned set of sub-structures of the wafer by determining a center point of the second box, wherein the second shift value corresponds to the center point of the second box; and
   compensating a focus shift of the illumination system based on a difference between the first shift value and the second shift value.

2. The method of claim 1, wherein the first pitch is about double the second pitch.

3. The method of claim 2, wherein the first pitch is about 65 nanometers.

4. The method of claim 1, wherein a line-space ratio of the first and second sets of sub-structures is about 1:1.

5. The method of claim 1, further comprising:
   illuminating, with a second focus, the photomask with asymmetric illumination and thereby patterning a layer over an additional wafer;
   measuring a third shift value for a first patterned set of sub-structures of the additional wafer;
   measuring a fourth shift value for a second patterned set of sub-structures of the additional wafer; and
   determining a difference between the third shift value and the fourth shift value, and
   wherein compensating the focus shift of the illumination system further comprises adjusting the illumination system based on the difference between the third shift value and the second shift value.

6. The method of claim 1, wherein compensating the focus shift of the illumination system based on the difference between the first shift value and the second shift value further comprises compensating the focus shift of the illumination system based on a plurality of differences between shift values from a plurality of wafers patterned using different focuses.

7. The method of claim 1, wherein the measuring the first shift value and the measuring the second shift value are performed off of a wafer production line.

8. The method of claim 1, wherein illumination system comprises an illuminator with an asymmetric arrangement of radiation-transmitting regions.

9. The method of claim 1, wherein the first set of sub-structures having the first pitch causes an asymmetry in the illumination directed to the wafer to pattern the first set and the second set of sub-structures having the second pitch, causes a symmetry in the illumination directed to the wafer to pattern the second set.

10. A method of monitoring focus of an EUV lithography system, the method comprising:
    measuring a first shift value for a first patterned set of sub-structures of a focus test structure on a wafer, wherein the first patterned set of sub-structures includes opposing first and second surfaces extending in a first direction and opposing third and fourth surfaces extending in a second direction perpendicular to the first direction;
    measuring a second shift value for a second patterned set of sub-structures of the test structure on the wafer, wherein:
       the second patterned set of sub-structures includes opposing fifth and sixth surfaces extending in the first direction and opposing seventh and eighth surfaces extending in the second direction;
       the test structure is formed on the wafer using asymmetric illumination; and
       the first patterned set of sub-structures has a first pitch and the second patterned set of sub-structures has a second pitch that is different from the first pitch; and
    determining a focus shift compensation for an illumination system based on a difference between the first shift value and the second shift value.

11. The method of claim 10, further comprising communication the focus shift compensation to the illumination system over a network.

12. The method of claim 10, wherein the first set of sub-structures of the test structure surrounds the second set of sub-structures.

13. The method of claim 10, wherein the first pitch is about 65 nanometers and the second pitch is about 32 nanometers.

14. The method of claim 10, further comprising:
    measuring a third shift value for a first patterned set of sub-structures of an additional test structure on an additional wafer;
    measuring a fourth shift value for a second patterned set of sub-structures of the additional test structure on the additional wafer; and
    determining a difference between the third shift value and the fourth shift value, and
    wherein determining a focus system modification for the illumination system further comprises determining the focus system modification based on the difference between the third shift value and the second shift value.

15. The method of claim 10, wherein determining the focus shift compensation for the illumination system further comprises compensating the focus shift of the illumination system based on a plurality of differences between shift values from a plurality of wafers patterned using different focuses.

16. The method of claim 10, wherein the focus test structure is a box-in-box test structure.

17. The method of claim 10, wherein illumination system comprises an asymmetric illuminator with an asymmetrical arrangement of at least one radiation-transmitting region.

18. The method of claim 17, wherein the at least one radiation transmitting region is characterized by an inner radius and an outer radius.

19. The method of claim 1, wherein:
    the determining of the center point of the first box includes a comparison of a group consisting of: an outer-edge-to-outer-edge comparison of the first box; an inner-edge-to-inner-edge comparison of the first box; and a midpoint-to-midpoint comparison of the first box; and
    the determining of the center point of the second box includes a comparison of a group consisting of: an outer-edge-to-outer-edge comparison of the second box; an inner-edge-to-inner-edge comparison of the second box; and a midpoint-to-midpoint comparison of the second box.

20. The method of claim 1, wherein:

the determining of the center point of the first box includes a comparison of a first surface of the first box to a second surface of the first box that is opposite the first surface of the first box with the second box disposed therebetween; and the determining of the center point of the second box includes a comparison of a first surface of the second box to a second surface of the second box that is opposite the first surface of the second box.

\* \* \* \* \*